(12) United States Patent
Chen et al.

(10) Patent No.: US 8,464,734 B2
(45) Date of Patent: Jun. 18, 2013

(54) APPARATUS FOR WET PROCESSING SUBSTRATE

(75) Inventors: Wen-Tsun Chen, Tayuan (TW);
Shin-Chih Liaw, Tayuan (TW);
Tao-Ming Liao, Tayuan (TW);
Chia-Hung Shen, Tayuan (TW);
Yun-Fei Lien, Tayuan (TW)

(73) Assignee: Zhen Ding Technology Co., Ltd.,
Tayuan, Taoyuan (TW)

( * ) Notice: Subject to any disclaimer, the term of this patent is extended or adjusted under 35 U.S.C. 154(b) by 792 days.

(21) Appl. No.: 12/636,886

(22) Filed: Dec. 14, 2009

(65) Prior Publication Data

US 2010/0170639 A1 Jul. 8, 2010

(30) Foreign Application Priority Data

Jan. 5, 2009 (CN) .......................... 2009 1 0300043

(51) Int. Cl.
*C23F 1/08* (2006.01)
*B08B 3/04* (2006.01)
(52) U.S. Cl.
USPC ................ 134/62; 134/61; 134/70; 134/71; 134/72; 156/345.15; 156/345.17
(58) Field of Classification Search
CPC ..... B08B 3/022; H01L 21/68; H01L 21/67793; H01L 21/67796; H05K 2203/1509
USPC ....................................................... 134/198
See application file for complete search history.

(56) References Cited

U.S. PATENT DOCUMENTS

| 5,368,643 | A | * | 11/1994 | Kuster | 118/324 |
| 5,564,889 | A | * | 10/1996 | Araki | 414/806 |
| 5,746,234 | A | * | 5/1998 | Jones | 134/64 R |
| 5,894,853 | A | * | 4/1999 | Fujisaki et al. | 134/26 |
| 6,167,322 | A | * | 12/2000 | Holbrooks | 700/112 |
| 6,371,716 | B1 | * | 4/2002 | Byun et al. | 414/416.03 |
| 6,435,330 | B1 | * | 8/2002 | Bonora et al. | 198/346.3 |
| 6,692,049 | B2 | * | 2/2004 | Holbrooks | 294/103.1 |
| 2005/0128451 | A1 | * | 6/2005 | Mitsui et al. | 355/53 |

FOREIGN PATENT DOCUMENTS

| TW | 346471 B | 12/1998 |
| TW | I271249 B | 1/2007 |
| TW | 200706475 A | 2/2007 |

* cited by examiner

*Primary Examiner* — Michael Kornakov
*Assistant Examiner* — Marc Lorenzi
(74) *Attorney, Agent, or Firm* — Altis Law Group, Inc.

(57) ABSTRACT

An exemplary apparatus for wet processing a substantially rectangular substrate includes a conveyor, a supporting mechanism, an adjusting mechanism, a processing module and a dosing system. The conveyor is configured for conveying the substrate to a wet process work station. The supporting mechanism is configured for supporting the substrate away from the conveyor. The adjusting mechanism is configured for adjusting the orientation of the substrate. The processing module is configured for obtaining an area of a surface of the substrate. The dosing system communicates with the processing unit, and is configured for dispensing a corresponding amount of wet processing liquid to the substrate to wet process the substrate according to the area of the surface of the substrate from the processing module.

13 Claims, 3 Drawing Sheets

APPARATUS FOR WET PROCESSING SUBSTRATE

BACKGROUND

1. Technical Field

The present disclosure generally relates to an apparatus for processing a substrate and, particularly, to an apparatus for wet processing a substantially rectangular printed circuit board (PCB).

2. Description of Related Art

In the manufacture of PCBs, it is normal practice to feed the boards through a series of processing machines via a conveyor system. The process includes resit stripping, pre-cleaning, etching, neutralizing, water rinsing, and drying. Pre-cleaning, etching, neutralizing, and water rinsing, are known as wet process steps. In these wet process steps, a spray system comprising at least one set of spray nozzles connected to spray pipes is arranged to face the conveyor system to spray PCBs on the conveyor system, such as with etchant to form circuits. The etchant is supplied by a dosing system, which is capable of supplying a constant predetermined amount of etchant.

However, the PCBs on the conveyor system will often be of different sizes. When such PCBs are conveyed to be etched by a same predetermined amount of etchant, some PCBs with relative small size may be over-etched, and some PCBs with relative large size may be under-etched. In such cases the electrical properties of the PCBs are affected.

What is needed, therefore, is an apparatus for wet processing a substrate which can overcome the above-described problem.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present light source module. Moreover, in the drawings, like reference numerals designate corresponding parts throughout the several views, and all the views are schematic.

DETAILED DESCRIPTION

Various embodiments will now be described in detail below and with reference to the drawings.

Figure 1:
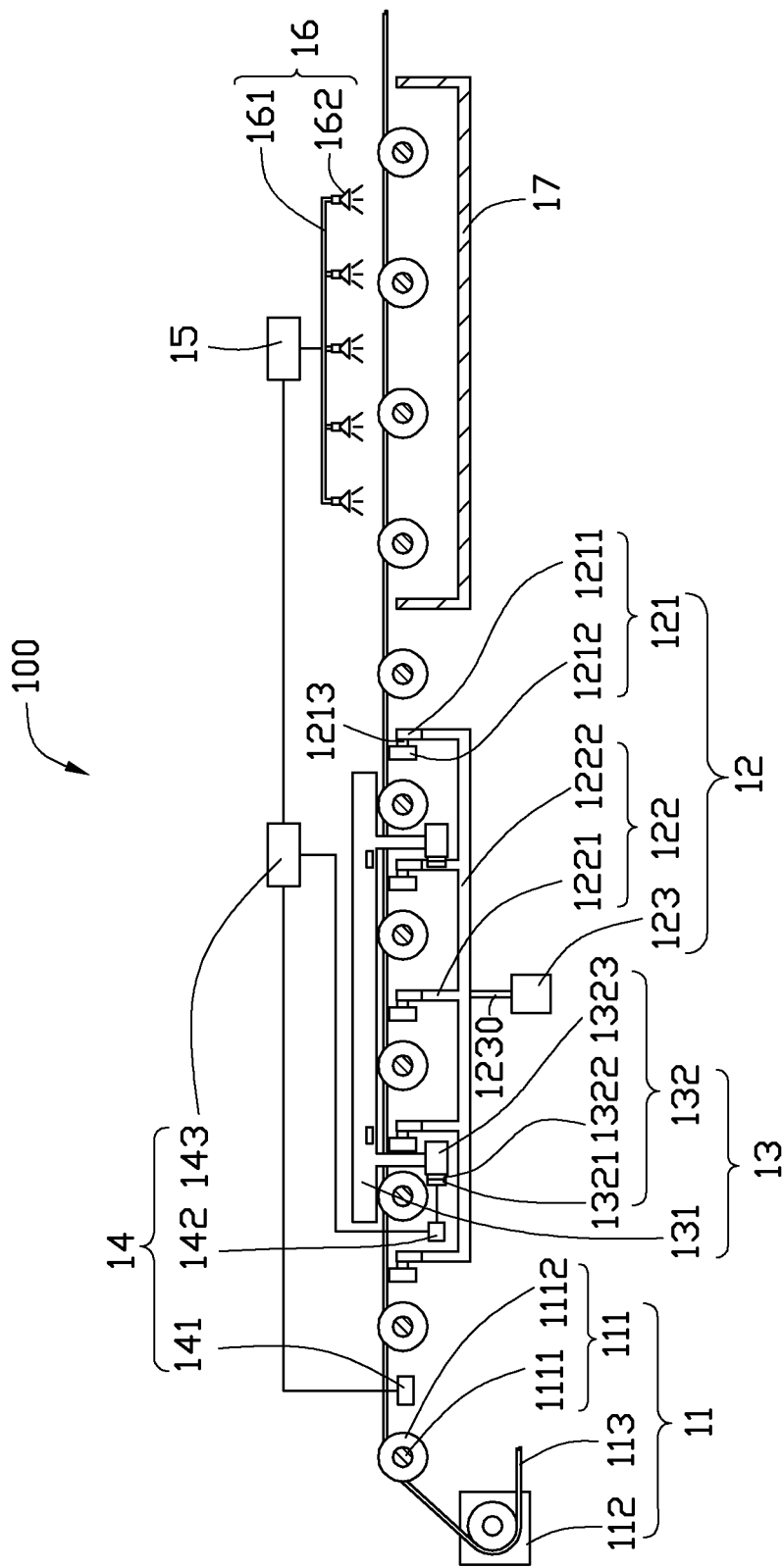
FIG. 1 is a cross-sectional schematic view of an apparatus for wet processing a substrate, in accordance with an embodiment, wherein the apparatus includes a conveyor, a supporting mechanism, an adjusting mechanism, a processing module, a dosing system, a spraying system, and a solution tank.

Referring to FIG. 1, an apparatus 10 for wet processing a substantially rectangular substrate, such as a PCB, is shown. The apparatus 10 includes a conveyor 11, a supporting mechanism 12, an adjusting mechanism 13, a processing module 14, a dosing system 15, a spraying system 16, and a solution tank 17. The dosing system 15, the spraying system 16, and the solution tank 17 constitute a wet process work station through which the conveyor 11 extends. The conveyor 11 is configured for conveying substrates placed thereon to pass through the wet process work station one by one. For example, the wet process work station can be an etching work station, and PCBs can be placed on the conveyor 11 and delivered to the etching work station to form circuits. The supporting mechanism 12 is arranged before the wet process work station, and is configured for sequentially raising the substrates away from the conveyor 11 and lowering the substrates back onto the conveyor 11. The adjusting mechanism 13 is arranged at two opposite sides of the supporting mechanism 12, and is configured for adjusting the orientation of the substrate raised by the supporting mechanism 12. The processing module 14 is configured for calculating an area of a surface of the adjusted substrate. The dosing system 15 is in communication with the processing module 14 and the spraying system 16, and is configured for dispensing a corresponding amount of wet processing liquid to the spraying system 16 according to the area of the surface of a corresponding substrate. The spraying system 16 is above the conveyor 11, and is configured for spraying the corresponding amount of wet processing liquid to the surface of the substrate to wet process the substrate. The solution tank 17 is below the conveyor 11, and is configured for receiving the wet processing liquid overflowed from the substrate.

Figure 2:
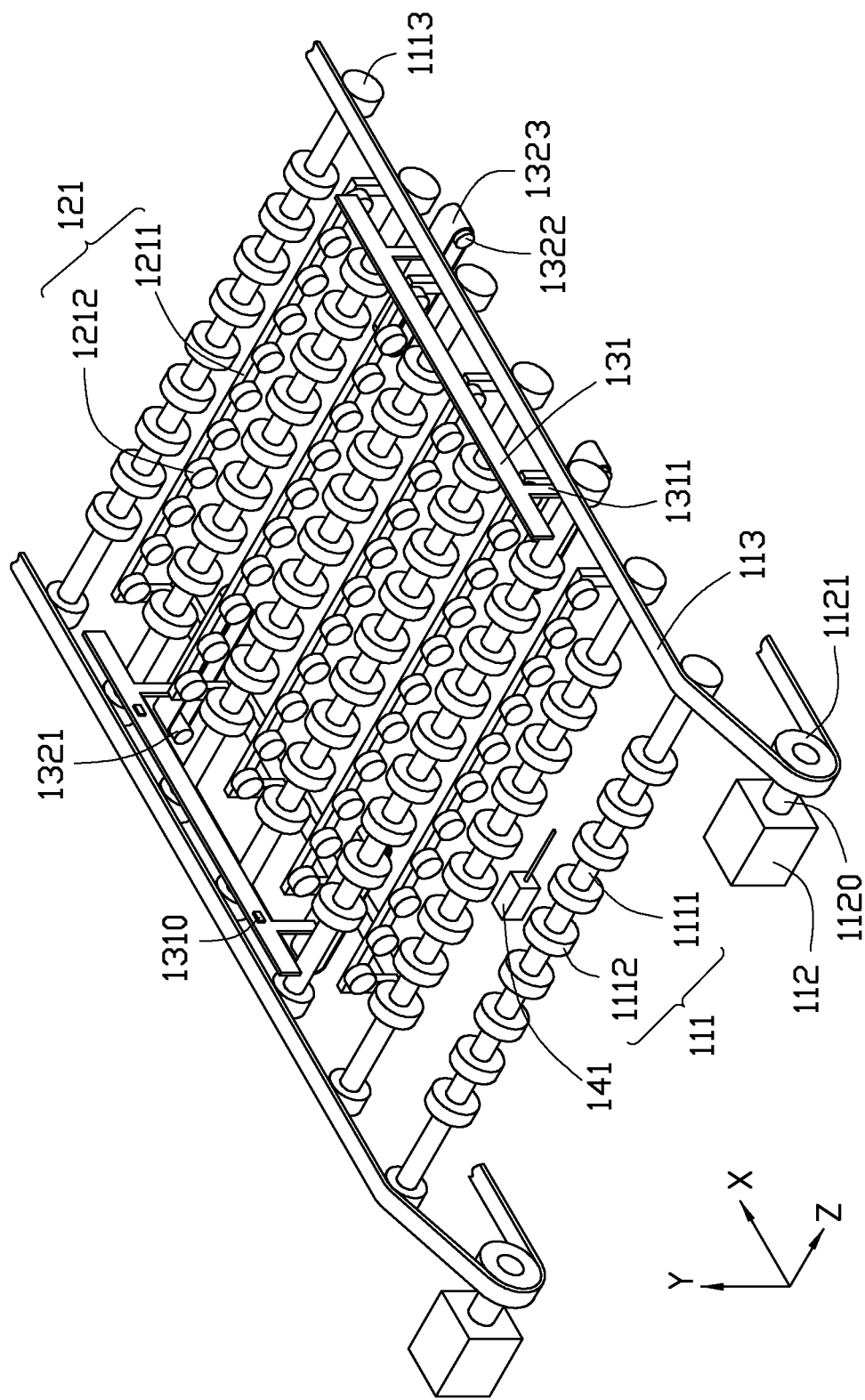
FIG. 2 is an isometric view of the supporting mechanism, the adjusting mechanism, and part of the conveyor of FIG. 1.

Referring to FIGS. 1 and 2, the conveyor 11 includes a plurality of spaced rollers 111, two motors 112, and two belts 113. Each roller 111 includes a rotatable shaft 1111 and a plurality of supporting wheels 1112 equidistantly fixedly mounted on the rotatable shaft 1111, wherein a central axis of each rotatable shaft 1111 is coaxial with central axes of the supporting wheels 1112 mounted thereon, and is parallel to a first direction Z. The supporting wheels 1112 are configured to be in contact with the substrates placed thereon, thereby supporting and delivering the substrates by rotating. Rotatable shafts 1111 of the rollers 111 are parallel to each other, and are equidistantly arranged along a second direction X, which is perpendicular to the first direction Z. Each rotatable shaft 1111 has two opposite ends, each of which has a first pulley 1113 mounted thereon. The motors 112 are arranged at two opposite sides of the rollers 111. Each motor 112 includes a driving shaft 1120 with a second pulley 1121 mounted thereon. One belt 113 is mechanically connected to one second pulley 1121 and a plurality of first pulleys 1113 mounted on one end of the rotatable shafts 1111, and the other belt 113 is mechanically connected to the other second pulley 1122 and a plurality of first pulleys 1113 mounted on the other end of the rotatable shafts 1111. In the illustrated embodiment, due to the belts 113 mechanically connecting the motors 112 to the rollers 111, when the motors 112 drive the rotatable shafts 1111 to rotate clockwise, the supporting wheels 1112 are driven to rotate in the same direction and are thereby capable of conveying the substrates thereon along the second direction X.

It is understood that the conveyor 11 is not limited to have the structure described above. For example, the conveyor 11 can have one belt 113 and one motor 112 only, with one end of each rotatable shaft 1111 mechanically connected to the motor and belt, and the other end of each rotatable shaft 1111 being movably mounted on a bearing.

The supporting mechanism 12 is adjacent to the conveyor 11, and is arranged before the solution tank 17. The supporting mechanism 12 includes a plurality of supporting elements 121, two connecting elements 122, and two cylinders 123. Each supporting element 121 includes a supporting shaft 1211 and a plurality of rotatable wheels 1212 equidistantly rotatably mounted on the supporting shaft 1211 by a plurality of pivots 1213, wherein a central axis of the supporting shaft 1211 is perpendicular to the central axes of the rotatable wheels 1212 mounted thereon and is parallel with the central axes of the rotatable shafts 1111. The supporting shafts 1211 are equidistantly arranged along the second direction X, and each supporting shaft 1211 is arranged between two adjacent rotatable shafts 1111. The rotatable wheels 1212 can rotate relative to the supporting shaft 1211. Each supporting shaft 1211 has two opposite ends, which are fixed on the two connecting elements 122, respectively. The connecting elements 122 are below the rollers 111, and are arranged on two opposite sides of the supporting elements 121. Each connecting element 122 includes a plurality of first connecting rods 1221 each connected with one supporting shaft 1211, and a second connecting rod 1222 adjoins the first connecting rods 1221, wherein a longitudinal direction of the second connecting rod 1222 is parallel with the second direction X, and longitudinal directions of the first connecting rods 1221 are parallel with a third direction Y, which is perpendicular to the first direction Z and the second direction X. The cylinders 123 are arranged below the connecting elements 122 and the rollers 111. Each cylinder 123 has a piston rod 1230, which extends along the third direction Y. The piston rods 1230 are connected with the second connecting rods 1222, respectively. Therefore, when the cylinders 123 drive the connecting elements 122 to move along the third direction Y, the supporting elements 121 are capable of raising a substrate on the conveyor 11 away from the conveyor 11 and lowering the substrate back onto the conveyor 11.

It is noted that the supporting mechanism 12 may have only one cylinder 123 if the connecting elements 122 are connected to each other.

The adjusting mechanism 13 includes two adjusting plates 131 and four driving units 132. The two adjusting plates 131 are arranged above the supporting wheels 1212 and the rotatable wheels 1112. One adjusting plate 131 is adjacent to one end of each supporting shaft 1211, and the other adjusting plate 131 is adjacent to the other end of each supporting shaft 1211. The adjusting plates are substantially rectangular, with longitudinal directions thereof parallel to the second direction X. In other words, the adjusting plates 131 are substantially parallel, and are opposite to each other. Each adjusting plate 131 is mechanically connected with two driving units 132 via two connecting arms 1311. Each driving unit 132 includes a driving wheel 1321, a driven wheel 1322, and a connecting belt 1323 mechanically connected between the driving wheel 1321 and the driven wheel 1322. Each connecting arm 1311 is fixed on a corresponding connecting belt 1323. The driving wheel 1321 and the driven wheel 1322 have central axes parallel to the second direction X, and are arranged along the first direction Z. The driving wheel 1321 can be a motor, or can be driven by a motor. In other words, the driving wheel 1321 is capable of driving the connecting belt 1323 to move and the driven wheel 1322 to rotate, thus a corresponding adjusting plate 131 can be driven to move along the first direction Z. That is, when the driving units 132 works, the adjusting plates 131 can be driven to be close to each other or far away from each other.

In the illustrated embodiment, each adjusting plate 131 has at least two touch sensors 1310 fixed in a surface opposite to the other adjusting plate 131, along the second direction X. The touch sensors 1310 fixed in the same adjusting plate 131 are in communication with corresponding driving units 132 mechanically connected to said adjusting plate 131, thus the corresponding driving units 132 can drive said adjusting plate 131 to move to be close to the other adjusting plate 131 until the touch sensors 1310 are both triggered, and then the corresponding driving units 132 can drive said adjusting plate 131 to move to be far away from the other adjusting plate 131. That is, when the substrate between the two adjusting plates 131 comes into contact with both of the adjusting plates 131, the adjusting plates 131 stop and then move far away from each other until back in position. When the adjusting plates 131 are close to each other, the substrate therebetween can be adjusted by movements of the adjusting plates 131 until all touch sensors 1310 are in contact with the substrate and triggered. The substrate is adjusted to be in the orientation corresponding to the spraying system 16 when the substrate is delivered to be below the spraying system 16.

It is noted that the number of the driving units 132 is not limited to be four, it is only necessary that each adjusting plate 131 can be driven by at least one corresponding driving unit 132.

The processing module 14 includes a length measuring unit 141 configured for measuring the length of the substrate, a width measuring 142 unit configured for measuring the width of the substrate, and a processing unit 143 connected to the length measuring unit 141 and the width measuring unit 142. The length measuring unit 141 is disposed before the supporting mechanism 12, and below the supporting wheels 1112. In other words, the length measuring unit 141, the supporting mechanism 12, and the solution tank 17 are arranged in sequence along the second direction X. The length measuring unit 141 can be a reflective sensor, such as an optical reflective sensor, a retro reflective sensor, or an infrared reflective sensor. The reflective sensor can detect the presence of an object and the length of the object by transmitting signals and receiving signals reflected by the object. In detail, the length of the object equals a conveying speed of the object multiplied by a time the signals take to be reflected by the object. The width measuring unit 142 is mounted on the adjusting mechanism 13, and is capable of obtaining a width of the substrate according to the rotation of the driving wheel 1321. In detail, the width measuring unit 142 can be two angular displacement sensors respectively mounted on two of the driving units 132, which correspond to the two adjusting plates 131, respectively. For example, the angular displacement sensors can be encoders, and can be mounted on the driving wheel 1321 of the driving units 132. Therefore, the angular displacement sensors can measure the displacement of the corresponding adjusting plates 131 according to the angular displacement of the driving wheels 1321 and thus can calculate the width of the substrate by subtracting the displacement of the adjusting plates 131 from the original distance of the adjusting plates 131. The processing unit 143 is configured for obtaining an area of a surface of the substrate according to the length and the width determined by the length measuring unit 141 and the width measuring unit 142, respectively.

It is understood that the width measuring unit 142 can include just one angular displacement sensor if the displacements of the adjusting plates 131 will be equal. The one angular displacement sensor can be mounted on any driving wheel 1321. Then the width of the substrate can be calculated by subtracting double the displacement of one adjusting plate 131 from the original distance of the adjusting plates 131. It is also understood that if the substrate on the conveyor 11 has a longitudinal direction perpendicular to the second direction X, then the length measuring unit 141 can obtain a width of the substrate, and the width measuring unit 142 can obtain a length of the substrate.

The dosing system 15 is electrically connected to the processing unit 143 of the processing module 14, and is communicated with the spraying system 16. The dosing system 15 is configured to dispense a corresponding amount of wet processing liquid to the spraying system 16 according to the area of the surface of the substrate. The wet processing liquid may be water, chemical etchant or some other liquid depending upon whether the process is washing, etching or for some other purpose to treat the substrate.

The spraying system 16 and the solution tank 17 are all arranged after the supporting mechanism 12, and are at two opposite sides of the rollers 111. The spraying system 16 can include a conduit 161 communicated with the dosing system 15, and a plurality of spray nozzles 162 equidistantly mounted on the conduit 161. The spray nozzles 162 are configured for spraying the wet processing liquid from the dosing system 15 to the surface of the substrate. The solution tank 17 is configured for collecting the wet processing liquid sprayed from the spray nozzles 162.

Figure 3:
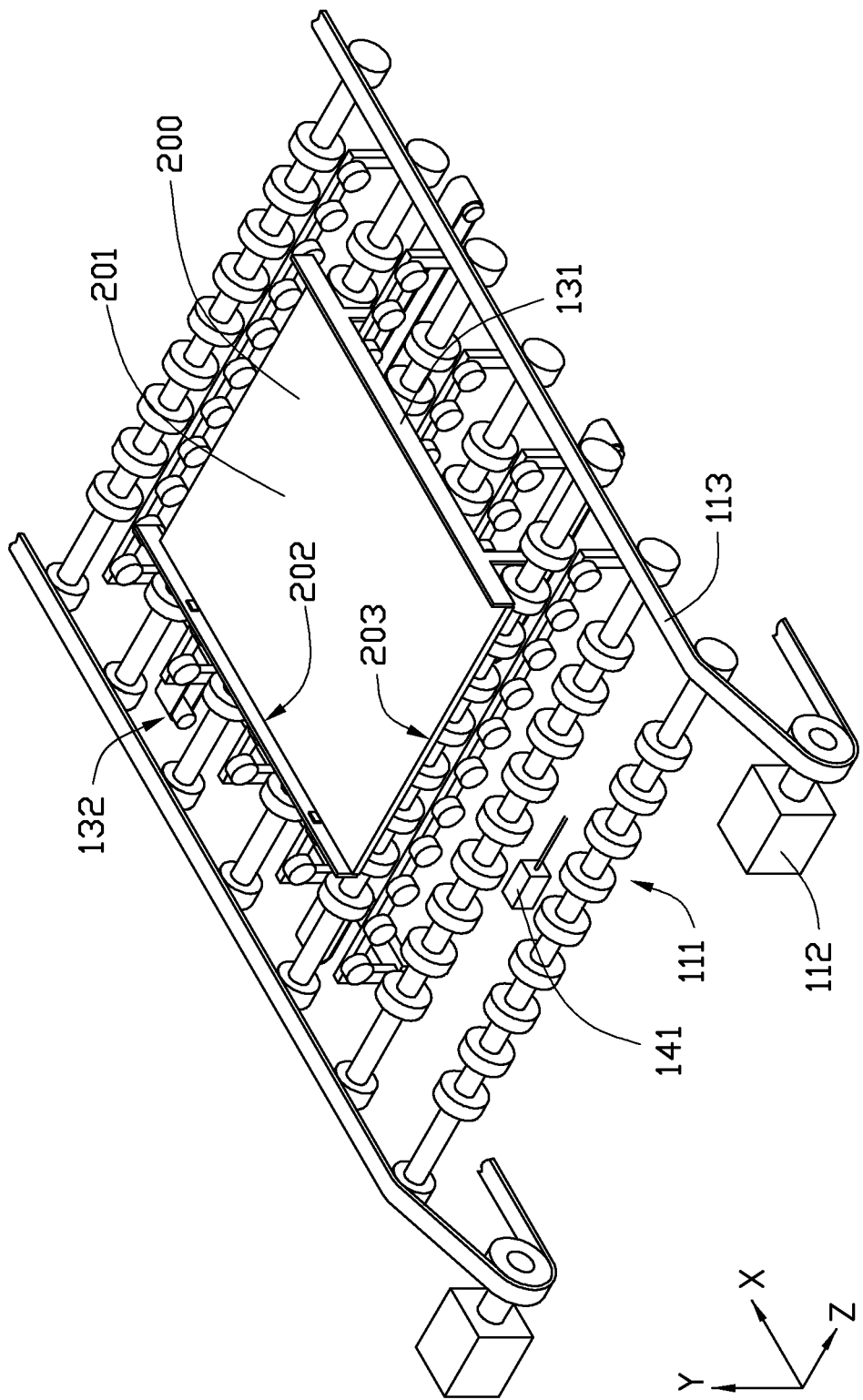
FIG. 3 is similar to FIG. 2, but showing a substrate on the conveyor being supported by the supporting mechanism and adjusted by the adjusting mechanism.

The apparatus 10 can spray a proper amount of wet process liquid to a substrate according to an area of a surface of the substrate, therefore the substrate can be processed properly. For example, a PCB 200, which includes a substantially rectangular top surface 201, two first side surfaces 202 adjoining at two opposite sides of the top surface 201, and two second side surfaces 203 adjoining at the other two opposite sides of the top surface 201, is placed on the conveyor 11 in such a manner that a longitudinal direction of the PCB 200 is parallel to the second direction X. The top surface 201 of the PCB 200 is perpendicular to the first side surfaces 202 and the second side surfaces 203, and is waited to be etched. The conveyor 11 can convey the PCB 200 along the second direction X from the length measuring unit 141 to the etching work station. When the PCB 200 is conveyed through the length measuring unit 141, a length of the PCB 200 can be obtained. When the PCB 200 is conveyed above the supporting mechanism 12, the supporting mechanism 12 can raise the PCB 200 away from the conveyor 11, and then the adjusting mechanism 13 can adjust an orientation of the PCB 200 to make the PCB 200 would be corresponding to the spray nozzles 162 when the PCB 200 is conveyed below the spraying system 16. The orientation of the PCB 200 is adjusted by the adjusting plates 131 by contacting the first side surfaces 202, as shown in FIG. 3. After the PCB 200 is adjusted, a width of the PCB 200 can be obtained by the width measuring unit 142. Then the supporting mechanism 12 lowers the PCB 200 back onto the conveyor 11 and the PCB 200 can be conveyed to the etching work station. Due to the processing unit 143 being able to obtain an area of the top surface 201, the dosing system 15 can dispense a proper amount of etchant to the spraying system 16 corresponding to the area of the top surface 201. In addition, due to the orientation of the PCB 200 corresponding to the spray nozzles 162, the etchant can be uniformly sprayed onto the top surface 201 thereby. Thus, the top surface 201 can be properly and uniformly etched. It is understood that when a plurality of PCBs 200 is delivered to the etching work station in sequence, every PCB 200 can be etched with a corresponding amount of etchant.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An apparatus for wet processing a substrate, the apparatus comprising:
    a conveyor configured for conveying a substrate along a first direction, the conveyor comprising a plurality of spaced rollers arranged along the first direction, central axes of the rollers being parallel to a second direction which is perpendicular to the first direction, and the rollers being capable of rotating about respective central axes thereof;
    a supporting mechanism capable of moving along a third direction which is perpendicular to the first direction and the second direction, the supporting mechanism being configured for supporting and moving the substrate away from the conveyor, the supporting mechanism comprising a plurality of supporting elements arranged along the first direction, each supporting element arranged between two adjacent rollers, each supporting element comprising a supporting shaft with a central axis parallel to the second direction and a plurality of spaced wheels mounted on the supporting shaft, central axes of the wheels being parallel to the first direction, and the wheels being capable of rotating about respective central axes thereof;
    an adjusting mechanism comprising two opposite adjusting plates arranged at opposite sides of the supporting mechanism, respectively, the adjusting plates being capable of moving along a second direction which is perpendicular to the first direction and the third direction to adjust an orientation of the substrate, the adjusting mechanism further comprising at least two driving units, each driving unit comprises a driving wheel, a driven wheel, and a connecting belt mechanically connected between the driving wheel and the driven wheel, wherein a central axis of the driving wheel is parallel to a central axis of the driven wheel and the first direction, the driving wheel is configured for driving the driven wheel to rotate, and each adjusting plate is mechanically connected with at least one driving wheel;
    a processing module comprising a first measuring unit adjacent to the conveyor, a second measuring unit mounted on the adjusting mechanism, and a processing unit connected with the first measuring unit and the second measuring unit, the first measuring unit being configured for obtaining a length of the substrate in the first direction, the second measuring unit being configured for obtaining a length of the substrate in the second direction, the processing unit being configured for obtaining an area of a surface of the substrate according to the lengths obtained from the first and second measuring units;
    wherein the second measuring unit includes at least one angular displacement sensor mounted on one of the driving wheels;
    wherein each adjusting plate has two touch sensors fixed at a surface facing toward the other adjusting plate, and the two touch sensors are aligned along the first direction;
    wherein the second measuring unit uses the touch sensors and angular displacement sensor to calculate the length of the substrate in the second direction;
    a dosing system configured for dispensing a corresponding amount of wet processing liquid to the substrate to wet process the substrate according to the area of the surface of the substrate obtained from the processing unit.

2. The apparatus of claim 1, further comprising a spraying system above the conveyor, the spraying system comprising a conduit communicating with the dosing system and a plurality of spray nozzles mounted on the conduit, and the spray nozzles being configured for spraying the corresponding amount of wet processing liquid to the surface of the substrate.

3. The apparatus of claim 2, further comprising a solution tank below the spray nozzles, the solution tank being configured for collecting wet processing liquid from the spray nozzles.

4. The apparatus of claim 1, wherein the first measuring unit includes a reflective sensor.

5. An apparatus for wet processing a substrate, the substrate comprising a rectangular top surface, two first side surfaces at two opposite sides of the top surface, and two second side surfaces at the other two opposite sides of the top surface, the top surface being perpendicular to the first side surfaces and the second side surfaces, the apparatus comprising:
- a conveyor configured for conveying the substrate along a first direction which is parallel to the first side surfaces and the top surface, the conveyor comprising a plurality of spaced rollers arranged along the first direction, central axes of the rollers being parallel to a second direction which is perpendicular to the first direction and parallel to the second side surfaces and the top surface, the rollers being capable of rotating about respective central axes thereof;
- a supporting mechanism capable of moving along a third direction which is perpendicular to the first direction and the top surface, the supporting mechanism being configured for supporting and moving the substrate away from the conveyor, the supporting mechanism comprising a plurality of supporting elements arranged along the first direction, each supporting element arranged between two adjacent rollers, each supporting element comprising a supporting shaft with a central axis parallel to the second direction and a plurality of spaced wheels mounted on the supporting shaft, central axes of the wheels being parallel to the first direction, the wheels being capable of rotating about respective central axes thereof;
- an adjusting mechanism comprising two opposite adjusting plates which are arranged on opposite sides of the supporting mechanism, respectively, the adjusting plates configured for moving toward each other to be in contact with two first side surfaces of the substrate to adjust the orientation of the substrate on the supporting mechanism, the adjusting mechanism further comprising at least two driving units, each driving unit comprises a driving wheel, a driven wheel, and a connecting belt mechanically connected between the driving wheel and the driven wheel, wherein a central axis of the driving wheel is parallel to a central axis of the driven wheel and the first direction, the driving wheel is configured for driving the driven wheel to rotate, and each adjusting plate is mechanically connected with at least one driving wheel;
- a processing module comprising a first measuring unit adjacent to the conveyor, a second measuring unit mounted on the adjusting mechanism, and a processing unit connected with the first measuring unit and the second measuring unit, the first measuring unit being configured for obtaining a length of the first side surfaces of the substrate, the second measuring unit being configured for obtaining a length of the second side surfaces of the substrate, the processing unit being configured for obtaining an area of the top surface of the substrate according to the lengths of the first and second side surfaces;
- wherein the second measuring unit includes at least one angular displacement sensor mounted on one of the driving wheels;
- wherein each adjusting plate has two touch sensors fixed at a surface facing toward the other adjusting plate, and the two touch sensors are aligned along the first direction;
- wherein the second measuring unit uses the touch sensors and angular displacement sensor to calculate the length of the second side surfaces of the substrate;
- a dosing system communicating with the processing unit, the dosing system being configured for dispensing a corresponding amount of wet processing liquid to the substrate to wet process the substrate according to the area of the top surface of the substrate obtained from the processing unit.

6. The apparatus of claim 5, further comprising a spraying system which comprises a conduit communicating with the dosing system and a plurality of spray nozzles mounted on the conduit, the spray nozzles being configured for spraying the corresponding amount of wet processing liquid to the top surface of the substrate.

7. The apparatus of claim 6, further comprising a solution tank below the spray nozzles, the solution tank being configured for collecting wet processing liquid from the spray nozzles.

8. The apparatus of claim 5, wherein the first measuring unit includes a reflective sensor.

9. An apparatus for wet processing a substrate, the apparatus comprising:
- a conveyor configured for conveying the substrate thereon, the conveyor comprising a plurality of spaced rollers arranged along a first direction, central axes of the rollers being parallel to a second direction which is perpendicular to the first direction, and the rollers being capable of rotating about respective central axes thereof;
- a supporting mechanism configured for raising the substrate away from the conveyor and lowering the substrate back onto the conveyor along a third direction perpendicular to the first and second directions, the supporting mechanism comprising a plurality of supporting elements arranged along the first direction, each supporting element arranged between two adjacent rollers, each supporting element comprising a supporting shaft with a central axis parallel to the second direction and a plurality of spaced wheels mounted on the supporting shaft, central axes of the wheels being parallel to the first direction, and the wheels being capable of rotating about respective central axes thereof;
- an adjusting mechanism comprising two opposite adjusting plates which are arranged on opposite sides of the supporting mechanism, respectively, the adjusting plates configured for moving toward each other to be in contact with two opposite sides of the substrate to adjust and maintain the orientation of the substrate, the adjusting mechanism further comprising at least two driving units, each driving unit comprises a driving wheel, a driven wheel, and a connecting belt mechanically connected between the driving wheel and the driven wheel, wherein a central axis of the driving wheel is parallel to a central axis of the driven wheel and the first direction, the driving wheel is configured for driving the driven wheel to rotate, and each adjusting plate is mechanically connected with at least one driving wheel;
- a processing module comprising a length measuring unit, a width measuring unit mounted on the adjusting mechanism, and a processing unit connected with the length measuring unit and the width measuring unit, the length measuring unit being configured for measuring a length of the substrate, the width measuring unit being configured for measuring a width of the substrate, the processing unit being configured for obtaining an area of a surface of the substrate according to the length and the width from the length measuring unit and the width measuring unit, respectively;

wherein the width measuring unit includes at least one angular displacement sensor mounted on one of the driving wheels;

wherein each adjusting plate has two touch sensors fixed at a surface facing toward the other adjusting plate, and the two touch sensors are aligned along the first direction;

wherein the width measuring unit uses the touch sensors and angular displacement sensor to calculate the width of the substrate;

a dosing system communicating with the processing unit, the dosing system being configured for dispensing a particular amount of wet processing liquid to the substrate to wet process the substrate according to the area of the surface of the substrate obtained from the processing unit.

10. The apparatus of claim 1, wherein the supporting mechanism further comprises a plurality of connecting elements below the rollers, each connecting element including a plurality of first connecting rods each connected with one supporting shaft, and a second connecting rod adjoining the first connecting rods, a longitudinal direction of the second connecting rod being parallel with the first direction, and longitudinal directions of the first connecting rods being parallel with the third direction.

11. The apparatus of claim 10, wherein the supporting mechanism further comprises a plurality of cylinders, each cylinder having a piston rod which extends along the third direction, the piston rods being connected with the second connecting rods and configured to drive the connecting elements to move along the third direction, making the supporting elements capable of raising a substrate along the third direction.

12. The apparatus of claim 10, wherein the driving wheels, the driven wheels and the connecting belts are arranged below the rollers.

13. The apparatus of claim 12, wherein the adjusting mechanism further comprises at least four connecting arms, each adjusting plate being mechanically connected with two driving units via two connecting arms, the adjusting plate being arranged above the rollers.

* * * * *